United States Patent
Seo et al.

(10) Patent No.: US 7,286,405 B2
(45) Date of Patent: Oct. 23, 2007

(54) PUMPING VOLTAGE GENERATING CIRCUIT IN NONVOLATILE SEMICONDUCTOR MEMORY DEVICE

(75) Inventors: Hui-Kwon Seo, Gyeonggi-do (KR); Woo-Il Kim, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 95 days.

(21) Appl. No.: 11/205,988

(22) Filed: Aug. 16, 2005

(65) Prior Publication Data
US 2006/0098487 A1  May 11, 2006

(30) Foreign Application Priority Data
Nov. 10, 2004  (KR) ............... 10-2004-0091200

(51) Int. Cl.
  *G11C 16/04* (2006.01)
(52) U.S. Cl. .............. 365/185.18; 365/185.23; 365/189.09
(58) Field of Classification Search .......... 365/185.18, 365/185.23, 189.09
See application file for complete search history.

(56) References Cited

U.S. PATENT DOCUMENTS 6,181,637 B1 *  1/2001  Nishimura et al. .... 365/230.06
6,449,208 B1 *  9/2002  Kono et al. ............. 365/226
7,031,202 B2 *  4/2006  Yoon et al. ............. 365/189.09
2006/0087886 A1 *  4/2006  Cho et al. .............. 365/185.18

FOREIGN PATENT DOCUMENTS

| JP | 8-255493 | 10/1996 |
| JP | 2002-236612 | 8/2002 |
| KR | 2001-0081243 | 8/2001 |
| KR | 2002-0039950 | 5/2002 |

* cited by examiner

*Primary Examiner*—Connie C. Yoha
(74) *Attorney, Agent, or Firm*—Marger Johnson & McCollom, P.C.

(57) ABSTRACT

Disclosed is a pumping voltage generating circuit in a nonvolatile semiconductor memory device. The present pumping voltage generating circuit begins a pumping operation for a wordline voltage in response to an accelerating start signal activated from a supply of an external program voltage, rather than a pumping enable signal activated from a program command. According to the pumping voltage generating circuit, the wordline voltage reaches a target voltage earlier, remarkably enhancing an overall operation speed in a nonvolatile semiconductor memory device.

7 Claims, 4 Drawing Sheets

PUMPING VOLTAGE GENERATING CIRCUIT IN NONVOLATILE SEMICONDUCTOR MEMORY DEVICE

CROSS-REFERENCE TO RELATED APPLICATIONS

This U.S. non-provisional patent application claims priority under 35 U.S.C. § 119 of Korean Patent Application No. 10-2004-91200 filed on Nov. 10, 2004, the entire contents of which are hereby incorporated by reference.

BACKGROUND

The present invention relates to a nonvolatile semiconductor memory device, and more particularly to a pumping voltage generating circuit employed in a nonvolatile semiconductor memory device.

In nonvolatile semiconductor memory devices, it is usual to apply a wordline voltage, a bitline voltage, and a bulk voltage respective to a wordline, a bitline, and a bulk voltage for programming and erasing operations. Such wordline and bulk voltages are high voltages, over the voltage level typically supplied from the external source (i.e., a power supply voltage). For the purpose of providing the high voltages in excess of the external power supply voltage internally, the nonvolatile semiconductor memory device generally employs a pumping voltage generating circuit therein.

FIG. 1 is a schematic diagram illustrating a conventional pumping voltage generating circuit in a nonvolatile semiconductor memory device. The conventional pumping voltage generating circuit includes a bulk voltage pump 130 generating a bulk voltage VBUK, a wordline voltage pump 140 generating a wordline voltage VPI, and a bitline voltage generator 150 outputting a bitline voltage VPB. When the bulk voltage VBUK, the wordline voltage VPI, and the bitline voltage VPB reach their target voltage levels, a pumping enable confirming circuit 60 generates signals to control program execution.

The bulk voltage VBUK is designed to be about −1V, having a small voltage gap from a ground voltage VSS that is the external supply voltage. Therefore, the bulk voltage VBUK arrives at the target voltage (i.e., −1V) relatively in an earlier time from a driving start time of the bulk voltage pump 130. Otherwise, the wordline voltage VPI, which is designed to be about +10V, has a high voltage gap from a power source voltage VCC (i.e., the external supply voltage). Thus, the wordline voltage VPI reaches its target voltage (+10V) in a longer time from a driving start time of the wordline voltage pump 130.

However, in the conventional pumping voltage generating circuit, the bulk voltage pump 130 and the wordline voltage pump 140 begin to pump their voltages both in response to a pumping enable signal /HVEN. During this pumping interval, the time to reach the target level of the wordline voltage VPI is longer than that of the bulk voltage VBUK.

As a result, a nonvolatile semiconductor memory device employing the conventional pumping voltage generating circuit has a disadvantage of degradation in an overall operation speed because the wordline voltage VPI reaches the target level later than the bulk voltage.

SUMMARY

The present invention is directed to a pumping voltage generating circuit of a nonvolatile semiconductor memory device, which enables a wordline voltage to reach a target level earlier.

An aspect of the invention to achieve the object is related to a pumping voltage generating circuit of a nonvolatile semiconductor memory device. The pumping voltage generating circuit is comprised of a sensing buffer and a wordline voltage pump. The sensing buffer activates an accelerating start signal in response to an external program voltage. The wordline voltage pump provides a wordline voltage to the wordline. The accelerated start signal is applied to the word line voltage pump. A program command is introduced preferably after the external program voltage is applied to the nonvolatile semiconductor memory device. A bulk voltage pump is enabled in response to the program command. The wordline voltage pump is enabled in response to the accelerating start signal before the bulk voltage is enabled in response to the program command.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 1:
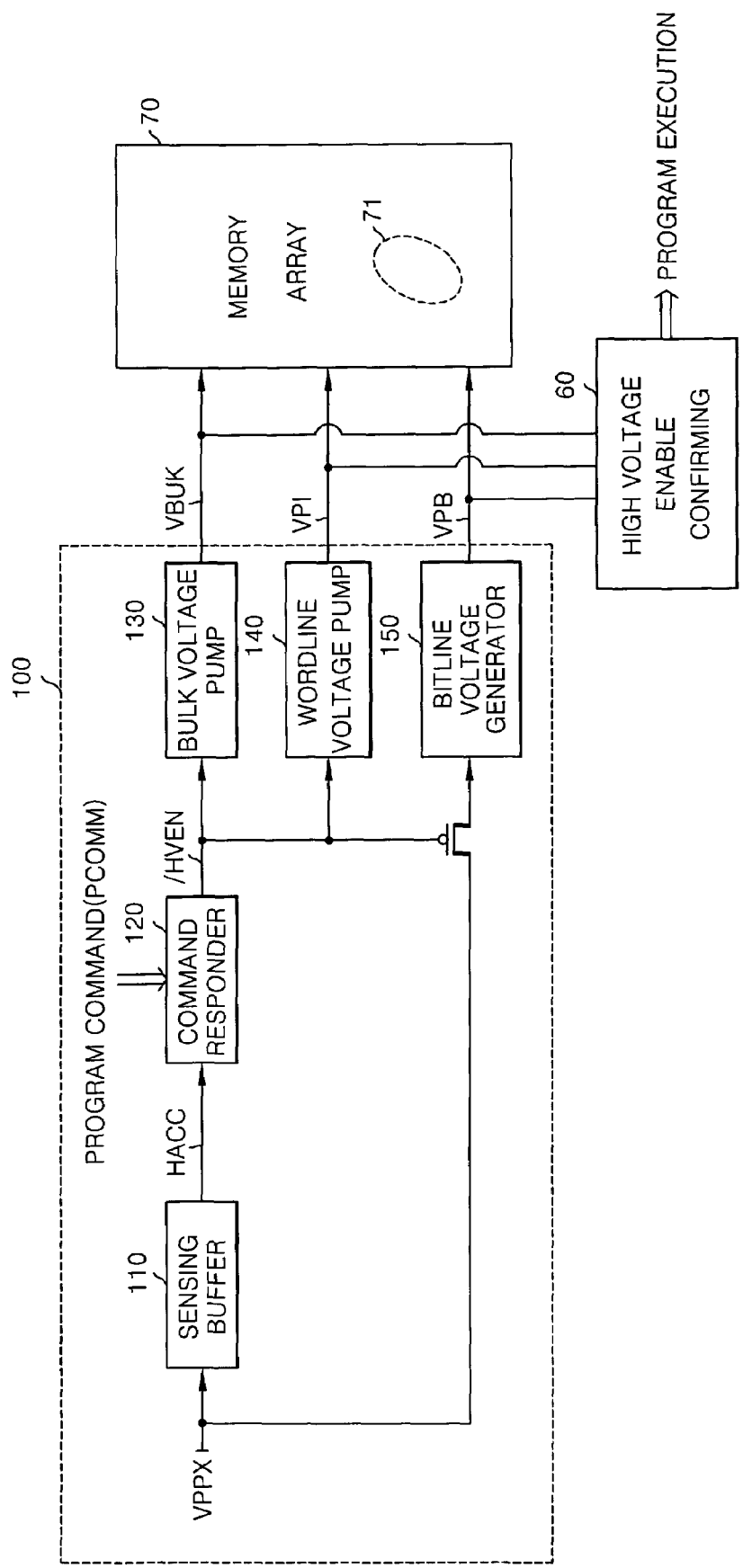
FIG. 1 is a schematic diagram illustrating a conventional pumping voltage generating circuit in a nonvolatile semiconductor memory device.
Figure 2:
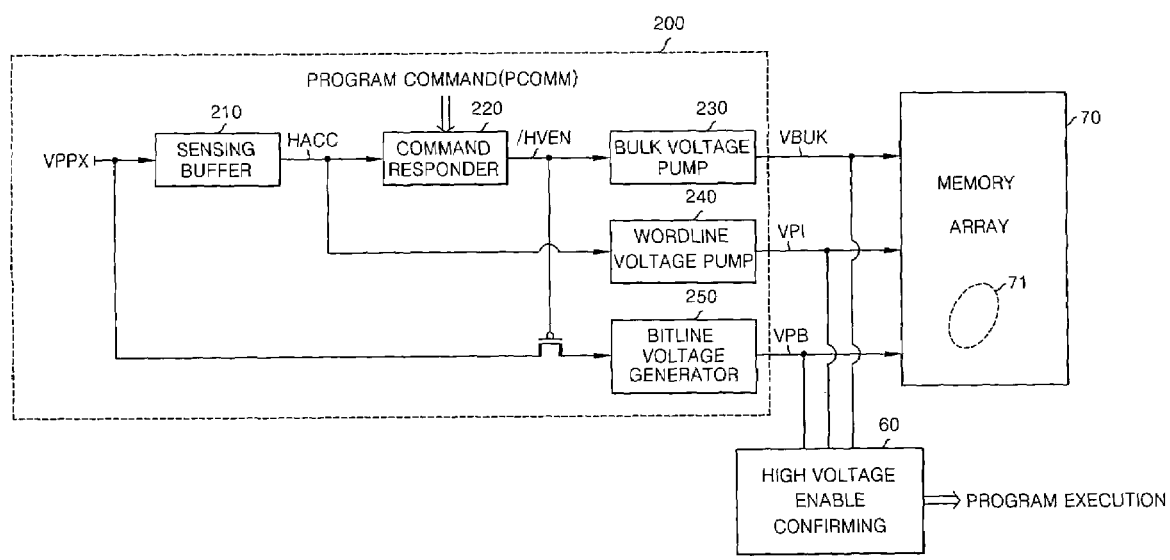
FIG. 2 is a block diagram illustrating a pumping voltage generating circuit in accordance with a preferred embodiment of the invention.
Figure 3:
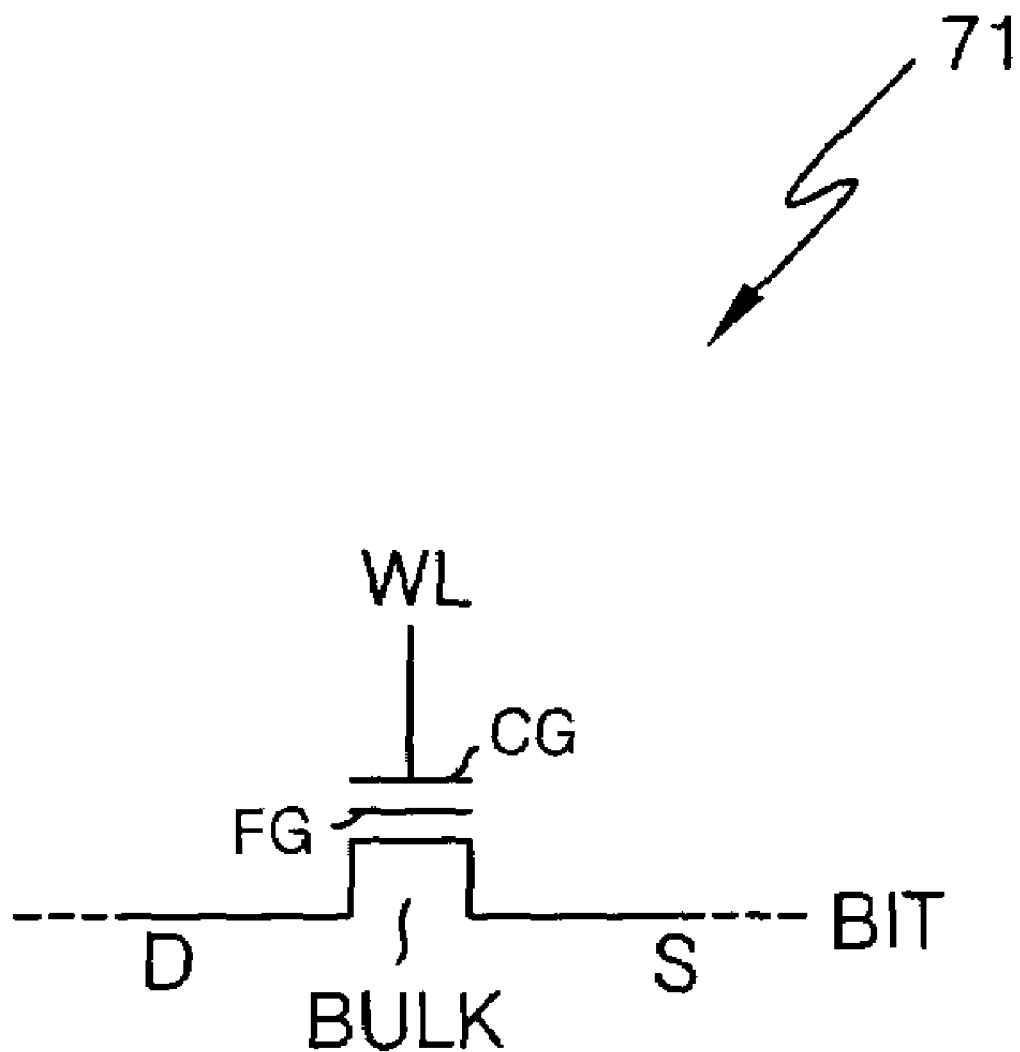
FIG. 3 is a diagram of illustrating a memory cell embedded in a memory cell array shown in FIG. 2.

FIG. 2 is a block diagram illustrating a pumping voltage generating circuit 200 in accordance with a preferred embodiment of the invention. FIG. 3 is a diagram illustrating a memory cell 71 embedded in a memory cell array 70 shown in FIG. 2.

First, referring to FIG. 3, the memory cell 71 comprises a source terminal S, a drain terminal D, a floating gate FG, and a control gate CG. The memory cell 71 is electrically programmable and erasable, which is formed on a bulk or a semiconductor substrate. A wordline WL is coupled to the control gate CG to gate the memory cell 71. The source terminal S or the drain terminal D of the memory cell 71 is connected a bitline BIT to input and output data. Programming and erasing operations with the memory cell 71 will not be described in detail because they are well known by those skilled in the art.

Referring to FIG. 2, the pumping voltage generating circuit 200 includes a wordline voltage pump 240. The wordline voltage pump 240 pumps the power source voltage up to provide the wordline voltage VPI to the wordline WL of the memory cell 71. A target level of the wordline voltage VPI is 15~20V as an example.

The wordline voltage pump 240 begins pumping in response to an accelerating start signal HVCC that is provided from a sensing buffer 210. The sensing buffer 210 detects an external program voltage VPPX supplied from a source external to circuit 200 and activates the accelerating start signal HVCC. The external program voltage VPRX is exemplarily set on 8V. It is preferred for the accelerating start signal HVCC to be active when the external program voltage VPPX rises over a predetermined voltage (e.g., 5V).

Therefore, as the wordline voltage pump 240 is enabled before generation of a program command PCOMM, the wordline voltage VPI is able to reach the target level earlier.

Meanwhile, the bulk voltage pump 230 pumps the ground voltage to provide the bulk voltage VBUK to the bulk of the memory cell 71. A target level of the bulk voltage VBUK is about −1V. The bulk voltage pump 230 begins pumping in response to the pumping enable signal /HVEN provided from a command responder 220. The command responder 220 activates the pumping enable signal /HVEN in response to the generation of the program command PCOMM. The program command PCOMM is the command to instruct the memory cell 71 for execution of a programming operation.

In other words, the wordline voltage pump 240 starts pumping sufficiently earlier than the bulk voltage pump 230 to make the wordline voltage VPI reach its target level not later than the bulk voltage VBUK reaches it target level.

The bitline voltage generator 250 provides the bitline voltage VPB to the bitline BIT of the memory cell 71. The bitline voltage generator 250 generates the bitline voltage VPB when the pumping enable signal /HVEN becomes active with "low (L)". A target level of the bitline voltage VPB is about 5V. Thus, the bitline voltage VPB is able to be obtained by the way of voltage division, which enables an earlier establishment of the target level of the bitline voltage VPB.

The high voltage enable confirming circuit 60 generates the signal to operate the programming operation for the memory cell 71 when the bulk voltage VBUK, the wordline voltage VPI, and the bitline voltage VPB all reach their target levels.

Figure 4:
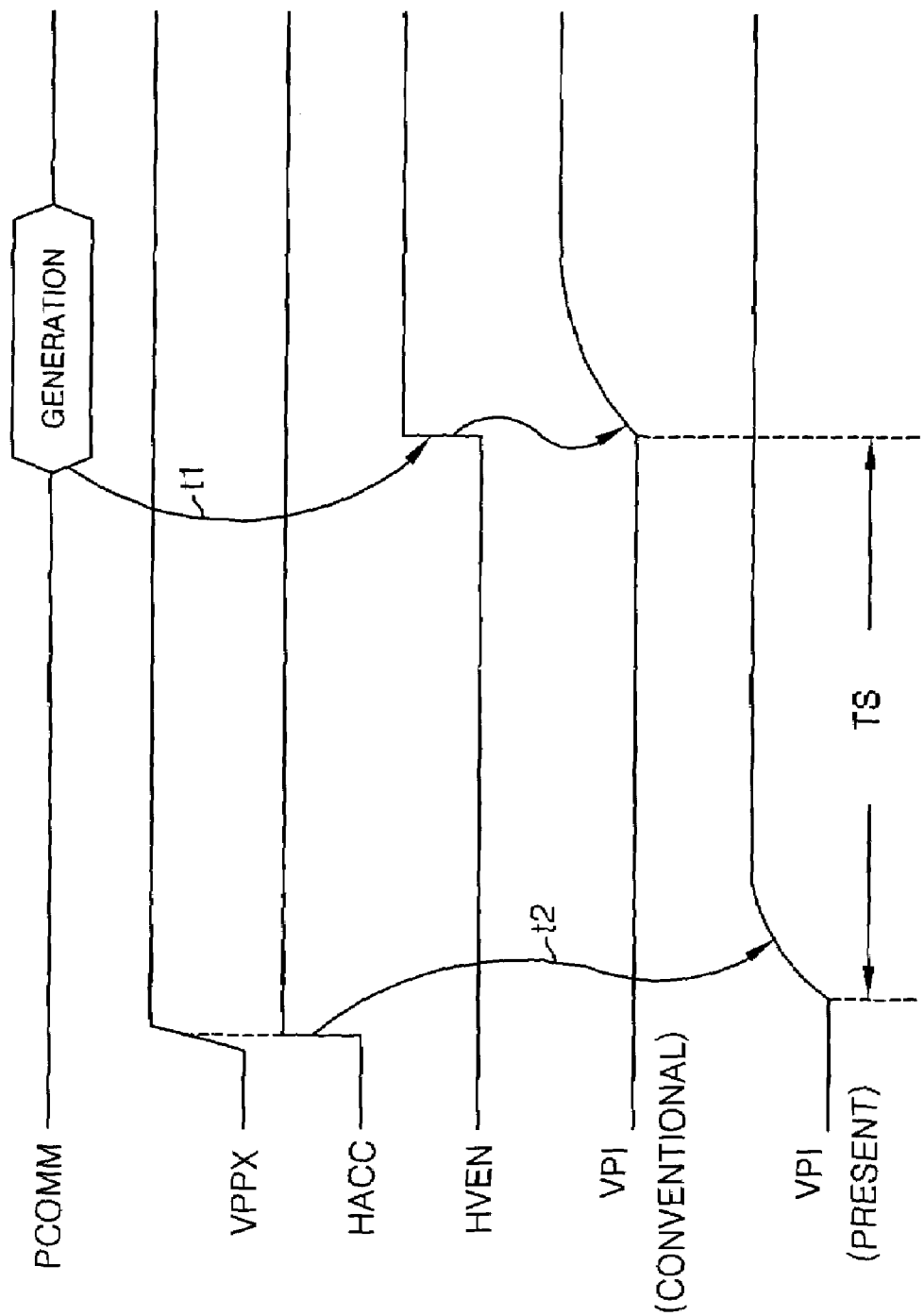
FIG. 4 is a diagram comparatively plotting wordline voltages of the conventional and present features.

FIG. 4 is a diagram comparatively plotting wordline voltages VPI of the conventional and present features. As illustrated in FIG. 4, the conventional wordline voltage begins rising in response to generation of a program command (t1). On the other hand, the present wordline voltage VPI begins rising in response to a supply of the external program voltage VPPX (t2).

Hence, the pumping voltage generating circuit 200 shown in FIG. 3 can shorten a time at which the wordline voltage VPI reaches its target level (by t5). As a result, an overall operating speed is improved in the nonvolatile semiconductor memory device.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

According to the pumping voltage generating circuit of the present invention, an operation of pumping the wordline voltage begins in response to the accelerating start signal that is active in accordance with a supply of the external program voltage, rather than responding to the pumping enable signal /HVEN. The wordline voltage reaches its target level earlier, which greatly improves overall operating speed of the nonvolatile semiconductor memory device.

What is claimed is:

1. A pumping voltage generating circuit of a nonvolatile semiconductor memory device having an electrically programmable and erasable memory cell that is formed in a semiconductor substrate with being gated by a wordline, the circuit comprising:

a sensing buffer activating an accelerating start signal in response to an external program voltage; and a wordline voltage pump providing a wordline voltage to the wordline, wherein a program command is introduced after the external program voltage is applied to the nonvolatile semiconductor memory device, wherein the wordline voltage pump is enabled in response to the accelerating start signal before generation of the program command.

2. The pumping voltage generating circuit as set forth in claim 1, wherein the accelerating start signal is activated in response to the external program voltage rising over a predetermined reference voltage.

3. A pumping voltage generating circuit of a nonvolatile semiconductor memory device having an electrically programmable and erasable memory cell that is formed in a semiconductor substrate with being gated by a wordline, the circuit comprising:

a sensing buffer activating an accelerating start signal in response to an external program voltage;

a command responder activated in response to the accelerating start signal and activating a pumping enable signal in response to generation of a program command; and a wordline voltage pump providing a wordline voltage to the wordline of the memory cell, wherein the wordline voltage pump is enabled in response to the accelerating start signal before generation of the program command.

4. The pumping voltage generating circuit as set forth in claim 3, which further comprises a bulk voltage pump providing a bulk voltage to the bulk of the memory cell, being enabled in response to the generation of the pumping enable signal.

5. A pumping voltage generating circuit of a nonvolatile semiconductor memory device having an electrically programmable and erasable memory cell that is formed in a semiconductor substrate with being gated by a wordline, the circuit comprising:

a wordline voltage pump providing a wordline voltage to the wordline; and a bulk voltage pump providing a bulk voltage to the bulk of the memory cell, wherein a program command is introduced after the external program voltage is applied to the nonvolatile semiconductor memory device, wherein the wordline voltage pump is enabled in response to the accelerating start signal, wherein the bulk voltage pump is enabled in response to generation of the program command.

6. In a semiconductor memory device having a nonvolatile memory array, a bulk voltage pump, a wordline voltage pump, and a command responder, a method of operation comprising:

applying an external programming voltage;

sensing the external programming voltage to produce an accelerating start signal;

enabling the wordline voltage pump responsive to the start signal;

inputting a program command signal after applying the external programming voltage, and the start signal, to the command responder to trigger outputting of a pumping enable signal; and enabling the bulk voltage pump responsive to the pumping enable signal.

7. A method according to claim 6 wherein the device further includes a bitline voltage generator and a high voltage confirming circuit, the method further including:

enabling the bitline voltage generator responsive to the pumping enable signal;

detect in the high voltage confirming circuit voltage outputs from each of the bulk voltage pump, the wordline voltage pump and the bitline voltage generator;

determining when each of the voltage outputs reaches a respective target voltage; and responsive to a determination that the voltage outputs have all reached their respective target voltages, outputting a program execution signal.

* * * * *